US010998719B2

(12) United States Patent
To et al.

(10) Patent No.: US 10,998,719 B2
(45) Date of Patent: May 4, 2021

(54) OVERVOLTAGE PROTECTION AND LINEAR REGULATOR DEVICE MODULE

(71) Applicant: Littelfuse Semiconductor (Wuxi) Co., Ltd., Jiangsu Province (CN)

(72) Inventors: Teddy C. T. To, Hong Kong (CN); Wei hua Tian, Jiangsu (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 0 days.

(21) Appl. No.: 16/728,589

(22) Filed: Dec. 27, 2019

(65) Prior Publication Data
US 2020/0136379 A1  Apr. 30, 2020

Related U.S. Application Data

(63) Continuation of application No. 16/093,951, filed as application No. PCT/CN2016/079354 on Apr. 15, 2016.

(51) Int. Cl.
*H02H 9/04* (2006.01)
*G05F 1/618* (2006.01)
(Continued)

(52) U.S. Cl.
CPC .............. *H02H 9/041* (2013.01); *G05F 1/56* (2013.01); *G05F 1/618* (2013.01); *H01L 29/866* (2013.01); *H02M 3/07* (2013.01)

(58) Field of Classification Search
CPC ........... G05F 1/56; G05F 1/618; H02H 9/041; H02M 3/07; H01L 29/866
(Continued)

(56) References Cited

U.S. PATENT DOCUMENTS 3,601,632 A * 8/1971 Frazier ..................... G05F 3/18
327/526
7,558,036 B2   7/2009 Wardzala
(Continued)

FOREIGN PATENT DOCUMENTS

CN       200969512 Y     10/2007
CN       201726130 U      1/2011
(Continued)

OTHER PUBLICATIONS

Machine translation of Chen et al. Chinese Patent Document CN 105068636 A Nov. 18, 2015 (Year: 2015).*
(Continued)

*Primary Examiner* — Kevin J Comber
(74) *Attorney, Agent, or Firm* — Kacvinsky Daisak Bluni PLLC (57) ABSTRACT

An apparatus may include a transient voltage suppression (TVS) device array coupled to a first input terminal and a second input terminal; and a linear regulator module having a pair of inputs connected to a respective pair of outputs of the TVS device array, wherein the TVS device array includes at least one TVS diode is connected between a first output and second output of the pair of outputs to generate a first clamping voltage signal, and wherein the linear regulator module is configured to generate a second clamping voltage signal having a second clamping voltage independent of a first clamping voltage of the first clamping voltage signal received from the TVS device array.

16 Claims, 6 Drawing Sheets

(51) Int. Cl.
*G05F 1/56* (2006.01)
*H01L 29/866* (2006.01)
*H02M 3/07* (2006.01)

(58) Field of Classification Search
USPC .......................................................... 361/56
See application file for complete search history.

(56) References Cited

U.S. PATENT DOCUMENTS

| | | | |
|---|---|---|---|
| 8,755,161 | B2 | 6/2014 | James |
| 2008/0055797 | A1 | 3/2008 | Wardzala |

FOREIGN PATENT DOCUMENTS

| | | | |
|---|---|---|---|
| CN | 102545145 | A | 7/2012 |
| CN | 202712837 | U | 1/2013 |
| CN | 203398780 | U | 1/2014 |
| CN | 104917368 | A | 9/2015 |
| CN | 105068636 | A | 11/2015 |
| TW | 200627741 | A | 8/2006 |
| TW | M305497 | U | 1/2007 |

OTHER PUBLICATIONS

Machine translation of Cheng et al. Chinese Patent Document CN 201726130 Jan. 26, 2011 (Year: 2011).*
Machine translation of He et al. Chinese Patent Document CN 200969512 Y Oct. 31, 2007 (Year: 2007).*
Linear Technology LT4363 High Voltage Surge Stopper with Current Limit (Year: 2011).*
International Search Report dated Dec. 29, 2016 for PCT/CN2016/079354, filed Apr. 15, 2016, 4 pages.
Written Opinion dated Dec. 29, 2016 for PCT/CN2016/079354, filed Apr. 15, 2016, 4 pages.

* cited by examiner

OVERVOLTAGE PROTECTION AND LINEAR REGULATOR DEVICE MODULE

CROSS REFERENCE TO RELATED APPLICATIONS

This application is a continuation of application Ser. No. 16/093,951, filed on Oct. 15, 2018, which is a 371 application of PCT/CN2016/079354, filed on Apr. 15, 2016, the entireties of which references are incorporated by reference herein.

BACKGROUND

Field

Embodiments relate to the field of semiconductor devices, and more particularly to overvoltage protection devices and linear regulators.

Discussion of Related Art

Over-voltage protection devices are used to protect electronic circuits and components from damage due to overvoltage fault conditions. Linear regulators constitute a class of device used to maintain a steady output voltage and protect against overvoltage conditions. Linear regulators may be used for protection applications in many different contexts, including automotive, aircraft, and military vehicle applications, to name a few. Different technologies may set different standards for operation, where the different standards may vary widely depending on the power or voltage to be dissipated to a safe level.

Conventional DC-DC converters of linear regulators may not be designed to accommodate satisfy the needs to clamp an overvoltage condition to a low or safe level as specified by the different standards, and to dissipate the power required.

It is with respect to these and other considerations that the present disclosure is provided.

SUMMARY

Exemplary embodiments are directed to improved overvoltage protection devices. In one embodiment, an apparatus may include a transient voltage suppression (TVS) device array coupled to a first input terminal and a second input terminal; and a linear regulator module having a pair of inputs connected to a respective pair of outputs of the TVS device array, wherein the TVS device array includes at least one TVS diode is connected between a first output and second output of the pair of outputs to generate a first clamping voltage signal, and wherein the linear regulator module is configured to generate a second clamping voltage signal having a second clamping voltage independent of a first clamping voltage of the first clamping voltage signal received from the TVS device array.

In another embodiment, a method of a method of providing overvoltage protection, may include receiving a voltage pulse in a transient voltage suppression (TVS) device array coupled to a first input terminal and a second input terminal, wherein the TVS device array includes at least one TVS diode is connected between the first input terminal and second input terminal; outputting a first clamping voltage signal from the TVS device array; receiving the first clamping voltage signal at a linear regulator module having a pair of inputs connected to a respective pair of outputs of the TVS device array; and outputting a second clamping voltage signal from the linear regulator, the second clamping voltage signal having a second clamping voltage less than a first clamping voltage of the first clamped voltage signal.

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and over, may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive—or", it may mean "one", it may mean "some, but not all", it may mean "neither", and/or it may mean "both", although the scope of claimed subject matter is not limited in this respect.

In various embodiments a hybrid apparatus is provided including a linear regulator and a transient voltage suppression (TVS) device array. These components together provide protection against events such as DC power line overvoltage events and inrush current, including events taking place on a millisecond (ms) time scale. In various embodiments a hybrid apparatus is provided that affords protection for automotive, aircraft, and military vehicle applications, where protection requirements for DC power systems may vary in order to provide proper protection for electronics equipment. The hybrid apparatus of the present embodiments may especially provide this overvoltage protection while maintaining efficient operation for a given system.

In various embodiments a hybrid apparatus may be incorporated in or disposed on a carrier or a board, such as a circuit board as known in the art. The apparatus may include a TVS device array having a two dimensional array of conductive nodes to accommodate TVS diodes mutually arranged among one another in electrical series and in electrical parallel fashion.

The array of TVS diodes may be adjusted for different surge requirements, where a single TVS diode is employed or a set of TVS diodes in series together with a parallel configuration of TVS diodes, depending on the surge test requirement. In different embodiments, the TVS diode array may be mounted on a circuit board in a through-hole configuration or alternatively may be arranged as a plurality of surface mounted devices.

Figure 1:
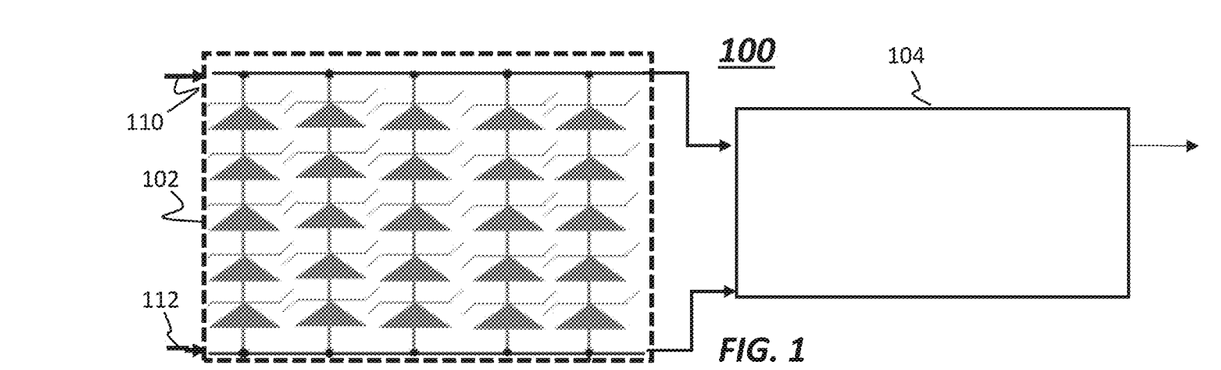
FIG. 1 presents a schematic of an apparatus according to embodiments of the disclosure.

FIG. 1 presents a schematic of an apparatus 100 according to embodiments of the disclosure. The apparatus 100 may provide overvoltage protection for a variety of applications where the type of overvoltage condition or surge may vary substantially. The apparatus 100 may be employed to satisfy the needs to help clamp down overvoltage to a low or safe level as required by different Standards. As shown in FIG. 1, the apparatus 100 may include a TVS device array 102 coupled to a first input terminal 110 and a second input terminal 112. In the event or an overvoltage condition where a high voltage develops between the first input terminal 110 and second input terminal 112, the apparatus 100 may clamp the voltage to provide an output voltage clamped to an acceptable level during the overvoltage condition. This clamping may protect a given component electrically connected to output terminals of the apparatus 100.

The apparatus 100 may further include a linear regulator module 104 having a pair of inputs connected to a respective pair of outputs of the TVS device array 102, where the architecture of the linear regulator module 104 and variants of the linear regulator module 104 are described below. In operation, the TVS device array 102 may generate a first clamping voltage signal, where this signal is transmitted to the linear regulator module 104, while the linear regulator module generates a second clamping voltage signal, wherein the second clamping voltage signal is independent of the first clamping. In particular, the TVS device array 102 may clamp the voltage to a first clamping voltage, while the linear regulator generates as second clamping voltage that is less than the first clamping voltage. The apparatus 100 may be particularly effective to regulate overvoltage events and inrush current on a direct current (DC) power line where the duration of the event is on the order of milliseconds. The embodiments are not limited in this context.

Figure 2A:
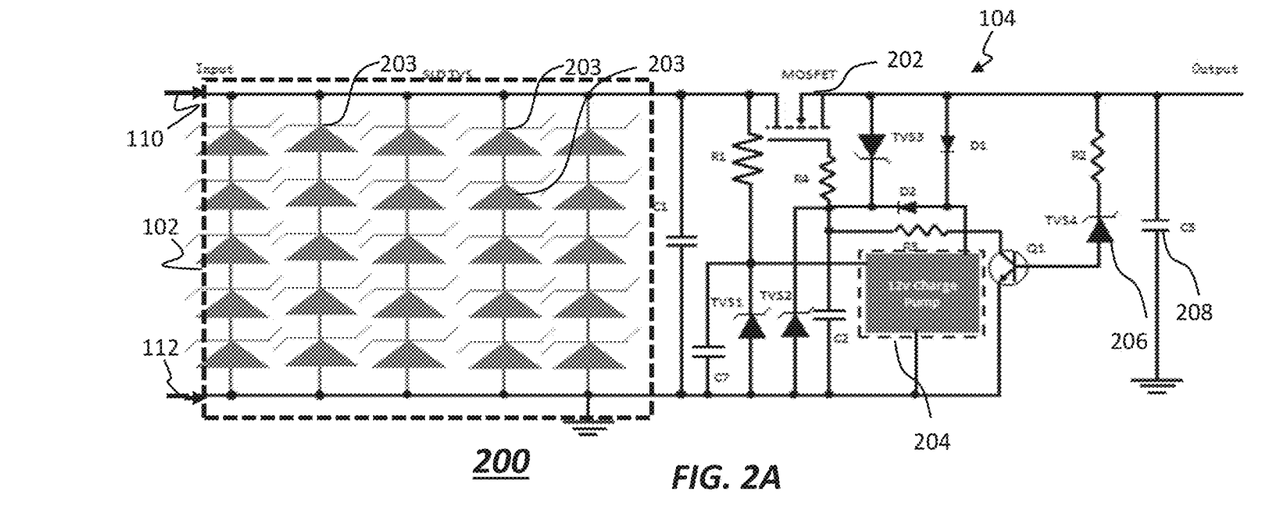
FIG. 2A presents a schematic of another apparatus according to embodiments of the disclosure.

FIG. 2A presents a schematic of another apparatus, shown as apparatus 200, according to some embodiments of the disclosure. The apparatus 200 may include the TVS device array 102 as described above, as well as linear regulator module 210 coupled to the output of the TVS device array 102. In this example, the TVS device array may contain a five by five matrix of TVS device positions or conductive nodes 203, as shown. In this example, the linear regulator module 210 includes a charge pump 20 output DC voltage filter 208 coupled to an output of the linear regulator module 210. The TVS diode 206 may be configured to set a maximum clamping voltage for the linear regulator module 210 according to a specific design. The linear regulator module 104 further includes a metal oxide field effect transistor, MOSFET 202, where the MOSFET 202 is coupled to an output of the TVS device array 102. In some examples, the MOSFET 202 may be interoperative with the TVS diode 206 to output the second clamping voltage signal at a voltage of 50 V or less.

According to different embodiments, when populated with devices, the TVS device array 102 may include diodes such as Zener diodes having a clamping voltage setting the clamping voltage for the TVS device array. Similarly, the TVS diode 206 may be a Zener diode in some embodiments, and in particular, the breakdown voltage of the TVS diode 206 may be 40 V or less in some embodiments.

As further suggested in FIG. 2A the TVS device array 102 may be arranged as a two dimensional array, where the array represents a set of electrically interconnected pads or conductive nodes 203, where different configurations of TVS diodes may be connected to desired nodes to provide the appropriate overvoltage protection. For example, the TVS device array 102 may represent a two dimensional circuit pattern configurable with at least one TVS diode placed at a given position (electrical node) in the pattern, to form an array of one or more electrically connected TVS diodes. In one example, a first set of TVS diodes (a given column of TVS diodes) in the TVS device array 102 is connected in electrical series between the first input terminal 110 and second input terminal 112, wherein at least one additional set of TVS diodes (another column of TVS diodes) is connected in electrical series between the first input terminal 110 and second input terminal 112. Furthermore the individual columns of TVS diodes may be arranged wherein the first set of TVS diodes is arranged in electrical parallel fashion to the at least one additional set of TVS diodes. As detailed below, this arrangement provides flexibility for addressing overvoltage surges for a variety of applications, where the number of TVS devices and the configuration of TVS devices in a TVS device array may be selectable according to the application in order to clamp an overvoltage event to an acceptable level before being received by an input terminal of a linear regulator. In addition, according to various embodiments, the breakdown voltage of the TVS diode 206 may be tailored according to the application. Moreover, the use of a TVS device array to clamp voltage provided to the linear regulator module 210 reduces the power dissipated by a MOSFET in an overvoltage event, and accordingly increases the upper limit of power handled by the apparatus 200, as detailed below.

Figure 2B:
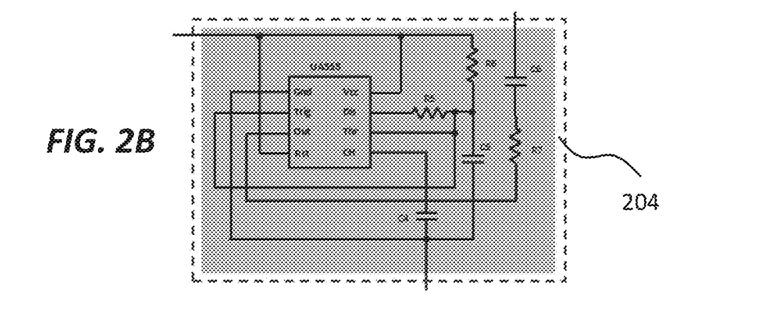
FIG. 2B presents a schematic of a charge pump of the apparatus of FIG. 2A.

FIG. 2B presents a schematic of a charge pump 204 of the apparatus 200 of FIG. 2A. In this example, the charge pump 204 may be designed as a 12V charge pump, while the embodiments are not limited in this context. In this example the charge pump 204 is built based on a known IC 555, and acts as a MOSFET driver to help drop out the input voltage to a lower output voltage. While this embodiment involves a linear DC regulator built using a charge pump and MOSFET, in other embodiments other type of DC/DC linear regulators may be used in conjunction with a TVS device array.

Figure 3:
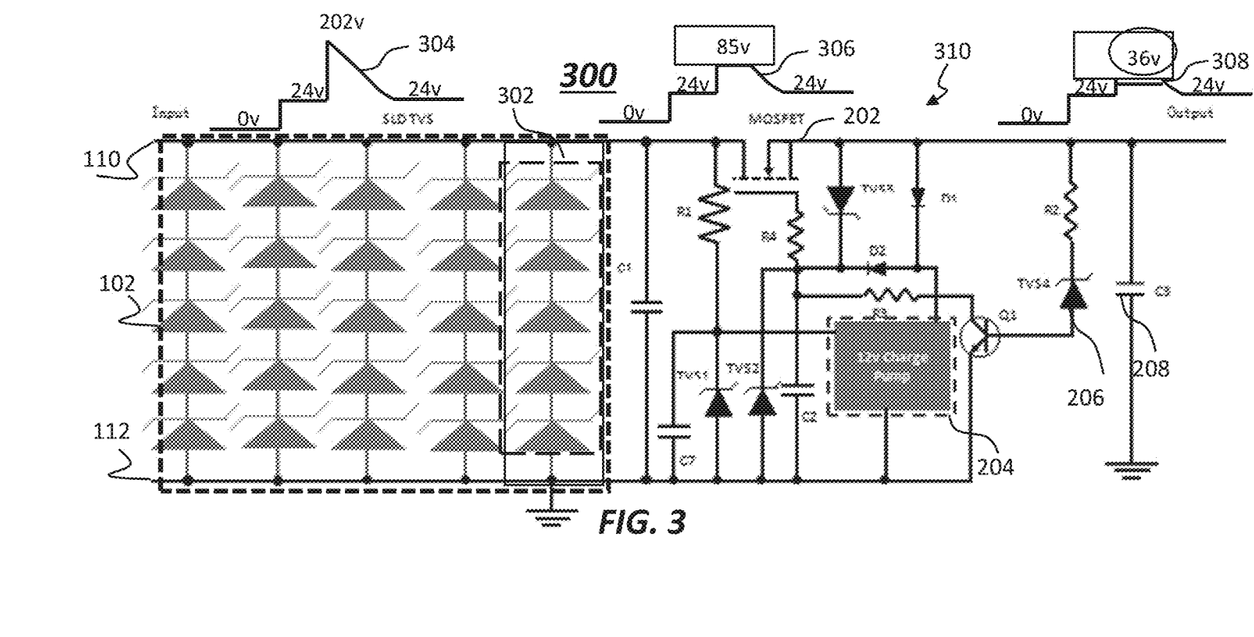
FIG. 3 presents a schematic of another apparatus according to embodiments of the disclosure.

FIG. 3 presents a schematic of another apparatus, shown as apparatus 300, according to embodiments of the disclosure. In this example, the apparatus 300 may be a variant of the apparatus 200, where a particular set of TVS diodes of the different positions of the TVS device array 102 is selected for use. FIG. 3 also presents an operation scenario where an overvoltage event represented by a 202V, 350 ms waveform takes place. The apparatus 300 may be designed for use in a 24V 150 W auto system, for example. As illustrated by the input voltage waveform 304, before an overvoltage event, the voltage between first input terminal 110 and second input terminal 112 is 24V as designed for the auto system. During the overvoltage event a peak voltage of 202 V is experienced between the first input terminal 110 and second input terminal 112. This voltage propagates through the TVS device array 102. In this embodiment the TVS device array is populated with a device group 302 configured to process the overvoltage event. The device group 302 represents a column of TVS devices arranged in electrical series, where the effective clamping voltage of the TVS device array may be a sum of the clamping voltages of the individual TVS devices of the device group 302. In the particular example of FIG. 3, all the TVS diodes may be the same, and a clamping voltage of approximately 17 V may apply to a given TVS device. Accordingly, the device group 302, being arranged in electrical series using five TVS devices, may exhibit a clamping voltage of approximately 85 V. This behavior is exhibited by the waveform 306, where the waveform 306 represents the voltage output by the TVS device array 102 in response to the input voltage waveform 304. As observed, a maximum voltage of 85V is output as a transient corresponding to the duration where the input voltage waveform 304 exceeds 85V.

As further shown in FIG. 3, the linear regulator module 310 is configured to output a waveform 308 in response to the overvoltage event generating the input voltage waveform 304. In this example, the TVS diode 206 may be configured to generate a clamping voltage of 36V, so the maximum voltage output by the linear regulator 310 is 36V, lasting for the duration where the waveform 306 exceeds 36V, as shown. Accordingly, in this example, a 24V 150 W auto system may be protected against a 202 V 350 ms overvoltage event, where the apparatus 300 outputs a 36 V for just a short duration.

Figure 4:
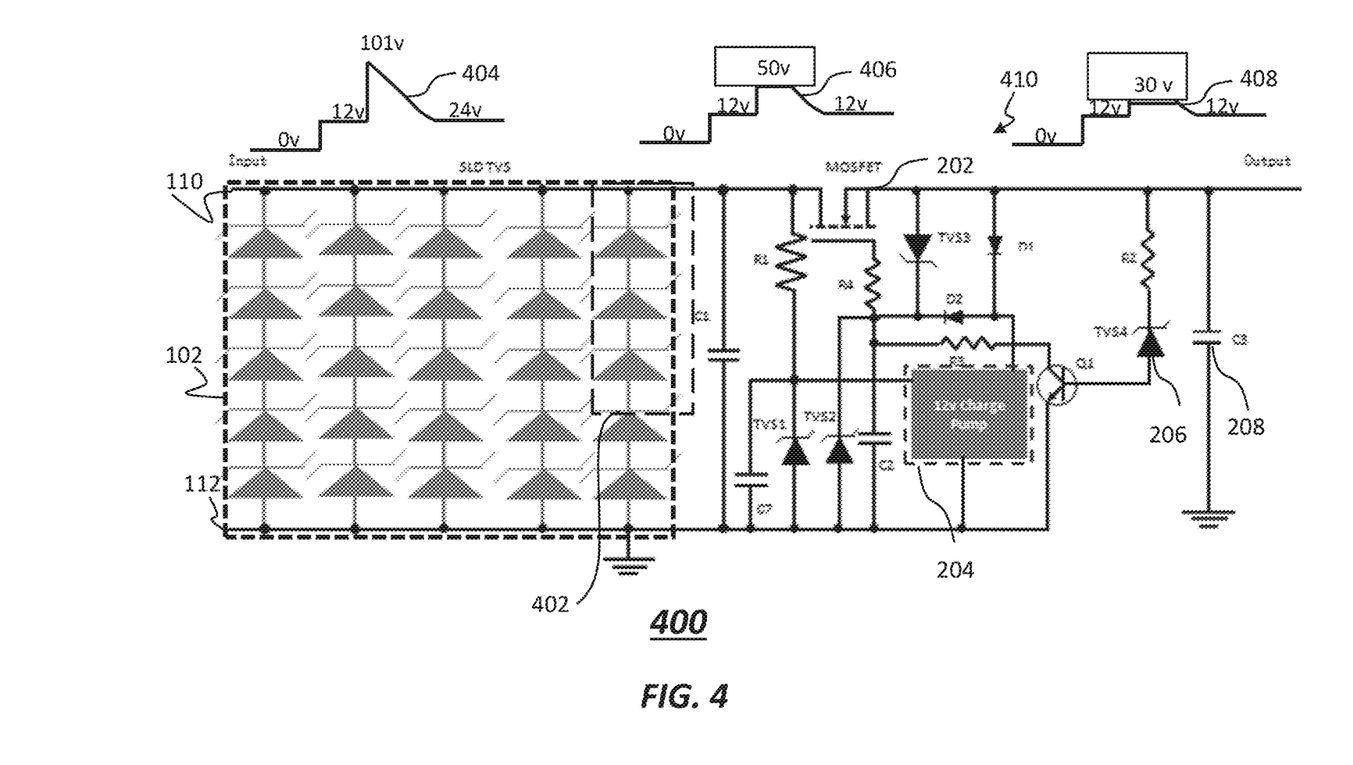
FIG. 4 presents a schematic of another apparatus according to embodiments of the disclosure.

FIG. 4 presents a schematic of another apparatus, shown as apparatus 400, according to other embodiments of the disclosure. In this example, the apparatus 400 may be a variant of the apparatus 200, where a particular set of TVS diodes of the different positions of the TVS device array 102 is selected for use. FIG. 4 also presents an operation scenario where an overvoltage event represented by a 101 v, 400 mS waveform takes place. The apparatus 400 may be designed for use in a 12 V 100 W Auto system, for example. As illustrated by the input voltage waveform 404, before an overvoltage event, the voltage between first input terminal 110 and second input terminal 112 is 12V as designed for the auto system. During the overvoltage event a peak voltage of 101 V is experienced between the first input terminal 110 and second input terminal 112. This voltage propagates through the TVS device array 102. In this embodiment the TVS device array is populated with a device group 402 configured to process the overvoltage event. The device group 402 represents a portion of a column of three TVS devices arranged in electrical series, where the effective clamping voltage of the TVS device array may be a sum of the clamping voltages of the individual TVS devices of the device group 402. In the particular example of FIG. 4, all the TVS diodes may be the same, and a clamping voltage of approximately 17 V may apply to a given TVS device. Accordingly, the device group 402, being arranged in electrical series using three TVS devices, may exhibit a clamping voltage of approximately 50 V. This behavior is exhibited by the waveform 406, where the waveform 406 represents the voltage output by the TVS device array 102 in response to the input voltage waveform 404. As observed, a maximum voltage of 50 V is output as a transient corresponding to the duration where the input voltage waveform 404 exceeds 50V.

As further shown in FIG. 4, the linear regulator module 410 module is configured to output a waveform 408 in response to the overvoltage event generating the input voltage waveform 404. In this example, the TVS diode 206 may be configured to generate a clamping voltage of 30V, so the maximum voltage output by the linear regulator module 410 is 30V, lasting for the duration where the waveform 406 exceeds 24V, as shown. Accordingly, in this example, a 12V 100 W auto system may be protected against a 101 V 400 ms overvoltage event, where the apparatus 400 outputs a 30 V for just a short duration.

Figure 5:
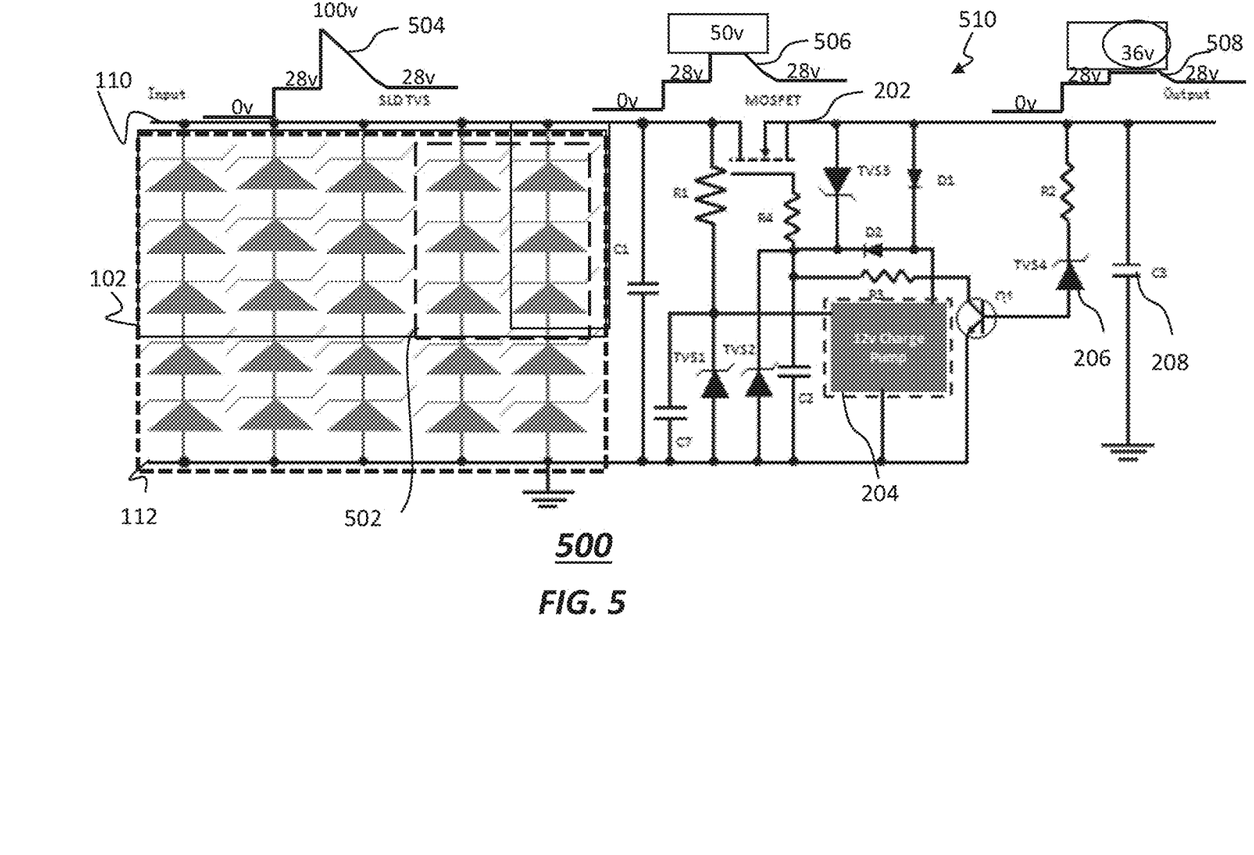
FIG. 5 presents a schematic of another apparatus according to embodiments of the disclosure.

FIG. 5 presents a schematic of another apparatus, shown as apparatus 500, according to other embodiments of the disclosure. In this example, the apparatus 500 may be a variant of the apparatus 200, where a particular set of TVS diodes of the different positions of the TVS device array 102 is selected for use. FIG. 5 also presents an operation scenario where an overvoltage event represented by a 100 V, 50 ms waveform takes place. The apparatus 500 may be designed for use in a 28 V 600 W Military system, for example. The apparatus 500 may be designed to protect against overvoltage pulses, such as a series of five pulses occurring at one second intervals. As illustrated by the input voltage waveform 504, before an overvoltage event, the voltage between first input terminal 110 and second input terminal 112 is 28V as designed for the military system. During the overvoltage event a peak voltage of 100 V is experienced between the first input terminal 110 and second input terminal 112. This voltage propagates through the TVS device array 102. In this embodiment the TVS device array is populated with a device group 502 configured to process the overvoltage event. The device group 502 represents a two by three array of TVS devices as shown, where two columns of devices are arranged electrically in parallel to one another, where a given column includes three TVS devices arranged in electrical series. The effective clamping voltage of the TVS device array may be a sum of the clamping voltages of the individual TVS devices within a given column of the device group 502. In the particular example of FIG. 5, all the TVS diodes may be the same, and a clamping voltage of approximately 17 V may apply to a given TVS device. Accordingly, the device group 502, having a given column where three TVS devices are arranged in electrical series, may exhibit a clamping voltage of approximately 50 V. This behavior is exhibited by the waveform 506, where the waveform 506 represents the voltage output by the TVS device array 102 in response to the input voltage waveform 504. As observed, a maximum voltage of 50 V is output as a transient corresponding to the duration where the input voltage waveform 504 exceeds 50V.

As further shown in FIG. 5, the linear regulator module 510 is configured to output a waveform 508 in response to the overvoltage event generating the input voltage waveform 504. In this example, the TVS diode 206 may be configured to generate a clamping voltage of 36V, so the maximum voltage output by the linear regulator module 510 is 36V, lasting for the duration where the waveform 506 exceeds 36V, as shown. Accordingly, in this example, a 28V 600 W military system may be protected against a 100 V 50 ms overvoltage event (e.g., 5 pulses in 5 seconds, where each pulse energy is less than 60 Joules), or series of overvoltage events, where the apparatus 500 outputs a 36 V signal for just a short duration.

Figure 6:
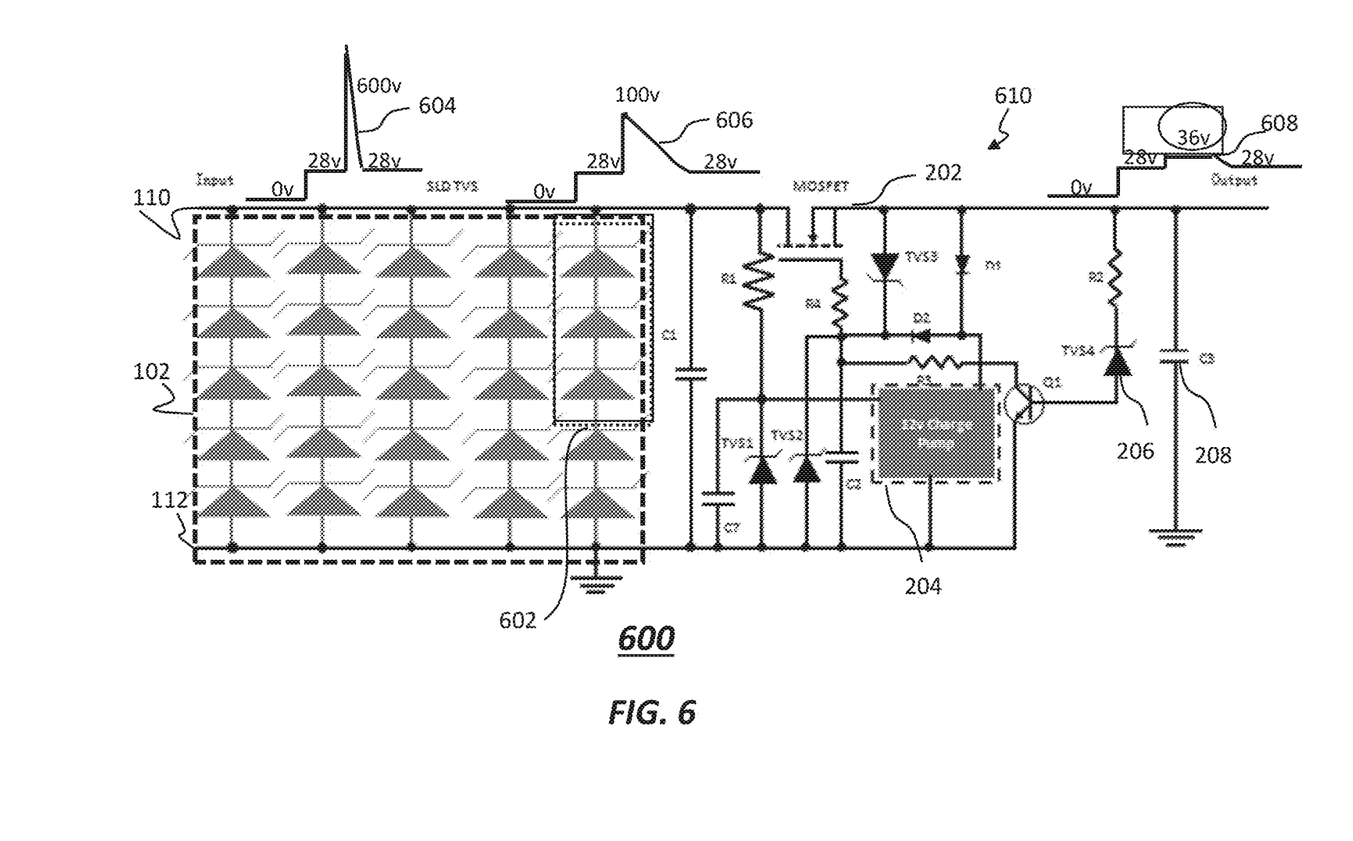
FIG. 6 presents a schematic of another apparatus according to embodiments of the disclosure.

FIG. 6 presents a schematic of another apparatus, shown as apparatus 600, according to other embodiments of the disclosure. In this example, the apparatus 600 may be a variant of the apparatus 200, where a particular set of TVS diodes of the different positions of the TVS device array 102 is selected for use. FIG. 6 also presents an operation scenario where an overvoltage event represented by a 600 V, 10 µs waveform takes place. The apparatus 600 may be designed for use in a 28 V 100 W aircraft system, for example. As illustrated by the input voltage waveform 604, before an overvoltage event, the voltage between first input terminal 110 and second input terminal 112 is 28 V as designed for the aircraft system. During the overvoltage event this voltage propagates as a peak voltage of 600 V experienced between the first input terminal 110 and second input terminal 112. In this embodiment the TVS device array is populated with a device group 602 configured to process the overvoltage event. The device group 602 represents a portion of a column of three TVS devices arranged in electrical series, where the effective clamping voltage of the TVS device array may be a sum of the clamping voltages of the individual TVS devices of the device group 602. In the particular example of FIG. 6, all the TVS diodes may be the same, and a clamping voltage of approximately 33 V may apply to a given TVS device. Accordingly, the device group 602, being arranged in electrical series using three TVS devices, may exhibit a clamping voltage of approximately 100 V. This behavior is exhibited by the waveform 606, where the waveform 606 represents the voltage output by the TVS device array 102 in response to the input voltage waveform 604. As observed, a maximum voltage of 100 V is output for a very short time corresponding to the duration where the input voltage waveform 504 exceeds 100V.

As further shown in FIG. 6, the linear regulator module 610 is configured to output a waveform 608 in response to the overvoltage event generating the input voltage waveform 604. In this example, the TVS diode 206 may be configured to generate a clamping voltage of 36V, so the maximum voltage output by the linear regulator module 610 is 36V, lasting for the duration where the waveform 606 exceeds 36V, as shown. Accordingly, in this example, a 28V 100 W aircraft system may be protected against a 600 V 10 μs overvoltage event, where the apparatus 500 outputs a 36 V for just a short duration.

Figure 7:
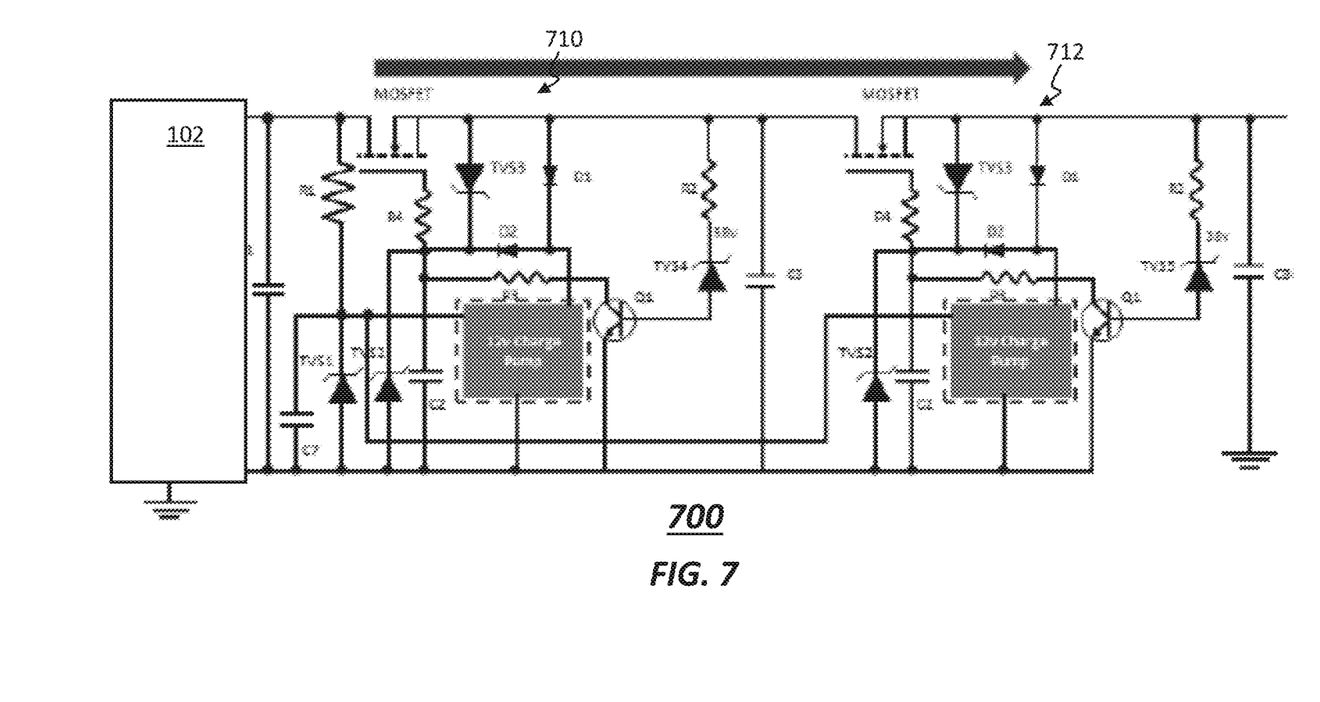
FIG. 7 presents a schematic of another apparatus according to embodiments of the disclosure.

FIG. 7 presents a schematic of another apparatus, shown as apparatus 700, according to other embodiments of the disclosure. In this example, the apparatus 700 may include a TVS device array 102, as discussed in the aforementioned embodiments, where any particular set of TVS diodes of the different positions of the TVS device array 102 may be populated onto the TVS device array 102 as discussed above. The apparatus 700 may differ from the aforementioned embodiments in that two different linear regulators are arranged in electrical series with the TVS device array 102 and are arranged in electrical series with one another. As shown in FIG. 7, a first linear regulator 710 coupled directly to the output of the TVS device array 102 may be connected on an output side to a second linear regulator 712. In one particular example, the first linear regulator 710 may be arranged in the event of an overvoltage event to output a clamping voltage of 58 V to the second linear regulator 712. The second linear regulator 712 in turn may be arranged to output a clamping voltage of 38 Vm for example. The embodiments are not limited in this context. This multiple linear regulator topology provides greater flexibility in handling high voltage overvoltage events, including higher current, for example.

Among other advantages afforded by the present embodiments, the provision of an architecture where a TVS device array is arranged in series with one or more linear regulators affords better handling of power during an overvoltage event. To illustrate this advantage, in one embodiment, the MOSFET 202 may be embodied as an IRFP4568. In one example, an initial input transient over voltage may be 100V 50 ms, while a thermal resistance of the MOSFET Rth(j-c) is 0.29 C/W, and the clamping voltage for the linear regulator 104 module is 40V. Assuming a load current of 3 A (100 W power) current going through the MOSFET 202, the junction temperature increase is given by (100−40)×3×0.29=−52.2° C. In the above example, a target upper junction temperature may be 150° C. To maintain junction temperature below 150° C., an initial start case temperature permitted is 150−52.2=97.8° C. Including a 5C buffer for multiple transient over voltage, an initial start case temperature allowed is 97.8−5=92.8° C.

While the MOSFET of a linear regulator such as MOSFET 202 may act as a regulator for an overvoltage events, the power dissipation of the MOSFET is limited by the load power. The higher the power, the more Ohmic loss is dissipated as heat in the MOSFET junction. For example, if a 202V load dump takes place on an IRFP4568 MOSFET, and the clamp voltage is set at 36V, then the temperature increase for this load dump is (202 −36)*I*0.29. Often, a 75° C. value may be set for initial MOSFET case temperature. This yields the equality (202−36)*I*0.29=150−75, or a value of maximum current, Imax=1.56 A. This means the power max allowed is 28*1.56=43.7 W. In the aircraft/military/auto applications, designers may consider increasing module power capability to drive different power system needs. In order to meet a 200 W power requirement, for example, using the above case where power maximum is 43.7 W for a given MOSFET, a parallel arrangement of many modules may be needed to meet the total power requirement. In particular, to meet the 200 W requirement, at least 5 modules working in parallel manner are needed where a given MOSFET handles a maximum of 43.7 W.

In contrast, in the architecture provided by the present embodiments, a TVS device array may conveniently provide a first clamped voltage of 65V in response to a 202V overvoltage event, in just one example. Accordingly, when a MOSFET 202 receives the 65V clamped voltage from the TVS device array 102, the power dissipation is much lower: (65 −36)*I*0.29=75, yielding an Imax=8.9 A. The maximum power dissipated in a single module is then given by 28*8.9=249.2 W. Accordingly, a single apparatus, such as apparatus 200, having a TVS array to output a clamped voltage of 65 V will suffice to handle at least 200 W input power.

In addition, in embodiments where two linear regulators are arranged in series as in FIG. 7, the power handling capability may be doubled with respect to an apparatus having just one linear regulator.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, and that it has the full scope defined by the language of the following claims, and equivalents thereof.

What is claimed is:

1. An apparatus, comprising:
 a transient voltage suppression (TVS) device array coupled to a first input terminal and a second input terminal, wherein the TVS device array includes a first set of TVS diodes connected in electrical series between the first input terminal and the second input terminal and at least one additional set of TVS diodes connected in electrical series between the first input terminal and the second input terminal, wherein the first set of TVS diodes is arranged in electrical parallel fashion to the at least one additional set of TVS diodes; and a linear regulator module having a pair of inputs connected to a respective pair of outputs of the TVS device array, wherein a first clamping voltage signal is generated from just a portion of the first set of TVS diodes or the at least one additional set of TVS diodes, the portion being less than all the TVS diodes of the first set of TVS diodes or less than all the TVS diodes of the at least one additional set of TVS diodes, and wherein the linear regulator module is configured to generate a second clamping voltage signal having a second clamping voltage independent of a first clamping voltage of the first clamping voltage signal received from the TVS device array.

2. The apparatus of claim 1, further comprising a charge pump coupled between ground and output voltage of the linear regulator module.

3. The apparatus of claim 1, the linear regulator module further comprising a TVS diode configured to set a maximum clamping voltage for the linear regulator module.

4. The apparatus of claim 3, the linear regulator module further comprising a metal oxide field effect transistor (MOSFET) coupled to an output of the TVS device array, the MOSFET interoperative with the TVS diode to output the second clamping voltage signal at a voltage of 40 V or less.

5. The apparatus of claim 3, wherein a clamping voltage of the TVS diode of the linear regulator module is 40 V or less.

6. The apparatus of claim 1, the TVS device array comprising a plurality of Zener diodes placed at a plurality of conductive nodes in the TVS device array.

7. The apparatus of claim 1, wherein the TVS device array is configured to dissipate at least 200 W input power.

8. The apparatus of claim 1, further comprising an output DC voltage filter coupled to an output of the linear regulator module.

9. The apparatus of claim 1, wherein the first clamping voltage is 110 V or less.

10. The apparatus of claim 1, the linear regulator module comprising a first linear regulator module, the apparatus further comprising a second linear regulator module connected to an output of the first linear regulator module, the second linear regulator module to output a third clamping voltage signal having a third clamping voltage independent of the second clamping voltage.

11. A method of providing overvoltage protection, comprising:

receiving a voltage pulse in a transient voltage suppression (TVS) device array coupled to a first input terminal and a second input terminal, wherein the TVS device array is connected between the first input terminal and second input terminal, wherein the TVS device array includes a first set of TVS diodes connected in electrical series between the first input terminal and second input terminal and at least one additional set of TVS diodes connected in electrical series between the first input terminal and second input terminal, wherein the first set of TVS diodes is arranged in electrical parallel fashion to the at least one additional set of TVS diodes;

outputting a first clamping voltage signal from the TVS device array, wherein the first clamping voltage is provided from just a portion of the first set of TVS diodes or the at least one additional set of TVS diodes, wherein the portion is less than all the TVS diodes of the first set of TVS diodes or less than all the TVS diodes of the at least one additional set of TVS diodes;

receiving the first clamping voltage signal at a linear regulator module having a pair of inputs connected to a respective pair of outputs of the TVS device array; and outputting a second clamping voltage signal from the linear regulator module, the second clamping voltage signal having a second clamping voltage less than a first clamping voltage of the first clamping voltage signal.

12. The method of claim 11, further comprising providing a TVS diode in the linear regulator module to set a maximum clamping voltage for the second clamping voltage signal.

13. The method of claim 12, wherein the linear regulator module further comprises a metal oxide field effect transistor (MOSFET) coupled to an output of the TVS array, the MOSFET interoperative with the TVS diode to output the second clamping voltage signal at a voltage of 40 V or less.

14. The method of claim 12, wherein a clamping voltage of the TVS diode of the linear regulator module is 40 V or less.

15. The method of claim 11, the TVS device array comprising a plurality of Zener diodes.

16. The method of claim 11, the linear regulator comprising a first linear regulator module, the method further comprising providing a second linear regulator module connected to an output of the first linear regulator module, and outputting from the second linear regulator module a third clamping voltage signal having a third clamping voltage independent of the second clamping voltage.

* * * * *